United States Patent
Bae (10) Patent No.: US 6,831,580 B2
(45) Date of Patent: Dec. 14, 2004

(54) DIGITAL-TO-ANALOG CONVERTER WITH LINEAR AMPLIFICATION RATE

(75) Inventor: Chang-Min Bae, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/213,810

(22) Filed: Aug. 7, 2002

(65) Prior Publication Data

US 2003/0112167 A1 Jun. 19, 2003

(30) Foreign Application Priority Data

Dec. 18, 2001 (KR) .................................. 10-2001-80476

(51) Int. Cl.⁷ ................................................ H03M 1/66
(52) U.S. Cl. ...................................... 341/144; 341/154
(58) Field of Search ................................ 341/108, 144, 341/136, 154, 162, 120

(56) References Cited

U.S. PATENT DOCUMENTS

| | | | | |
|---|---|---|---|---|
| 3,573,795 A | * | 4/1971 | Bowers et al. | 341/108 |
| 3,997,892 A | * | 12/1976 | Susset | 341/136 |
| 5,528,241 A | * | 6/1996 | Negishi et al. | 341/144 |
| 5,841,382 A | * | 11/1998 | Walden et al. | 341/120 |
| 6,307,490 B1 | * | 10/2001 | Litfin et al. | 341/121 |
| 6,486,817 B1 | * | 11/2002 | Okada et al. | 341/154 |
| 6,518,910 B2 | * | 2/2003 | Sakuragi et al. | 341/162 |

FOREIGN PATENT DOCUMENTS

| | | | |
|---|---|---|---|
| DE | 3311067 | * | 3/1982 |
| JP | 01-114216 | | 5/1989 |
| JP | 010014872 A | | 2/2001 |
| KR | 2001-14872 | | 2/2001 |

OTHER PUBLICATIONS

Korean Intellectual Property Office, Official Action for Application No. 2001–80476 dated Dec. 13, 2003.
Notice of Preliminary Rejection from Korean Intellectual Property Office, dated Jul. 21, 2004 with English Translation (4 pages).

* cited by examiner

Primary Examiner—Jean Bruner Jeanglaude
(74) Attorney, Agent, or Firm—Marshall, Gerstein & Borun LLP (57) ABSTRACT

Digital-to-analog converters are disclosed that include a complementary metal-oxide semiconductor (CMOS) image sensor, which can control the brightness of a stored image delicately. The digital-to-analog converter includes: an array of resistors with weights on their resistance value, to distribute a voltage delicately and develop a plurality of analog signals; a switching circuit to select and output one of the analog signals of the arrayed resistors in response to a digital control code; and an output circuit to buffer and develop the output of the switching circuit.

8 Claims, 7 Drawing Sheets

DIGITAL-TO-ANALOG CONVERTER WITH LINEAR AMPLIFICATION RATE

FIELD OF THE INVENTION

The present invention relates to a digital-to-analog converter used in a complementary metal-oxide semiconductor (CMOS) image sensor circuit; and, more particularly, to a digital-to-analog converter that makes the amplification rate of a pixel signal change linearly according to digital control codes inputted thereto.

DESCRIPTION OF RELATED ART

Generally, an image sensor is a device that captures images by using a photo-reactive characteristic of a semiconductor. With different brightness and wavelength, every aspect of a subject existing in nature shows a different electrical value at each pixel of a sensing device. It is the image sensor that converts the electrical values into signals that can be processed.

Recently, image sensors have received additional attention as they are applied to a variety of security equipment, video conference cameras, digital still cameras, PC cameras, next-generation PDAs, with a function of transmitting image information and other data.

Image sensors are classified into two types: One type is a charge-coupled device (CCD) image sensor; and the other type is a complementary metal-oxide semiconductor (CMOS) image sensor. Compared to a CCD image sensor, a CMOS image sensor can be operated more easily and implement a variety of scanning methods. Also, because a CMOS image sensor is capable of integrating a single processing circuit in one chip, the CMOS image sensor may assist in miniaturizing products as well as reducing production costs with its CMOS technology. Additionally, with remarkably low power consumption when compared to the CCD, the CMOs image sensor's applicable fields continue to expand.

Conventionally, a CMOS image sensor comprises a comparator for comparing a ramp signal, as a reference signal, which decrease regularly, and an analog data signal from a photodiode; a counter to initiate counting when the ramp signal is outputted; and a latch for storing a counted value in a digital data value according to the value of the comparison result.

To perform the operation described above, the CMOS image sensor includes a digital control block for outputting various control signals. The digital control block sets up a range of storable digital data values, for example, from 0 to 255, according to the brightness of an image, by inputting a digital control code with a digital-to-analog converter. A digital control code is a control code a user inputs arbitrarily that controls the range of storable digital data values according to the brightness of an external light.

The CMOS image sensor equips the digital-to-analog converter at the digital control block so as to set up the range of digital data values (e.g. 0–255). According to the output voltage from the digital-to-analog converter, the unit voltage of a ramp signal according to the reference clock is determined.

For example, when an input digital control code is binary '00001', the range of storable digital data values is binary '00000000–11111111' (0–255). If the input digital control code is binary '00010', the range of digital data values is binary '00000000–01111111' (0–127). Similarly, if the input digital control code is binary '00100', the range of digital data values becomes binary '00000000–00111111' (0–63). When the input digital control code is binary '01000', the range becomes binary '00000000–00011111' (0–31).

The bigger the range of digital data values is, the brighter the image is stored. When a digital data value is 255, the screen becomes about twice as bright as when the digital data value is 127. Therefore, if a user wants to see a dark part brighter, the range of storable digital data values should be increased by making the value of a digital control code smaller.

Figure 1:
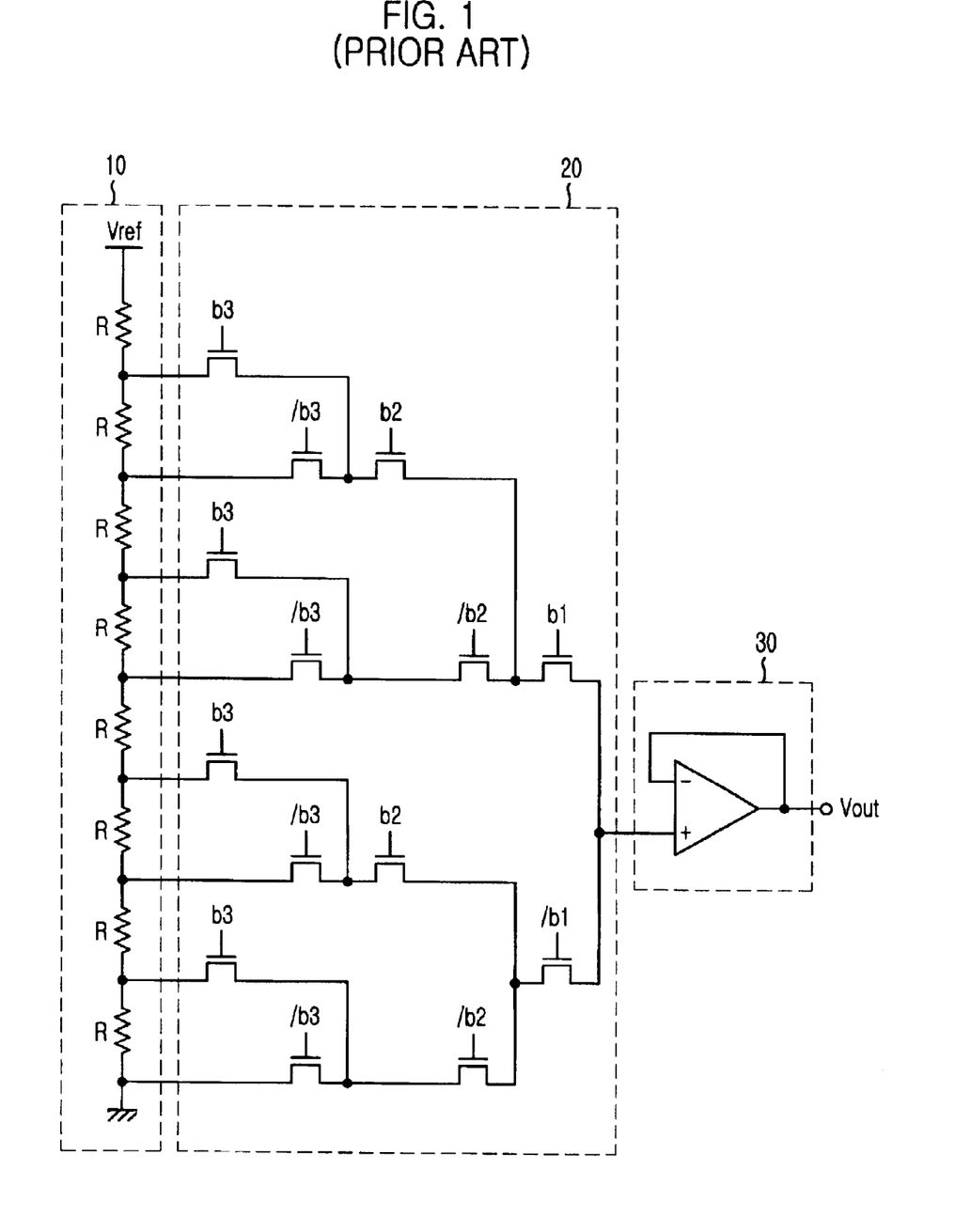
FIG. 1 is a circuit diagram illustrating a digital-to-analog converter of a conventional CMOS image sensor, which is implemented in three bits.

FIG. 1 is a circuit diagram illustrating a digital-to-analog converter of a conventional CMOS image sensor, which is implemented in three bits.

Referring to FIG. 1, the digital-to-analog converter comprises a voltage divider 10 for equally distributing a reference voltage; a switching block 20 for switching the distributed resistances to an output block; and an output block 30 for outputting signals through the switching block 20.

The voltage divider 10 is composed of eight resistors (R) serially arrayed between the reference voltage (Vref) and the ground voltage level. The switching block 20 is comprised of a plurality of N channel MOS transistors configured so that only one path should be selected by a decoded digital value. The output block 30 is comprised of an operation amplifier that feedbacks the output to a negative (−) input and thus serves as a buffer. When connected as shown in FIG. 1, an operation amplifier operates as a buffer with a gain of 1.

Referring to FIG. 1, the operation of a digital-to-analog converter will be described below.

When the reference voltage (Vref) from the circuit shown in FIG. 1 is '1V' and the digital control code '001' is inputted into the switching block 20, switches receiving the signals /b1, /b2, /b3 inputted to the switching block 20 are turned on, and a voltage of $\frac{1}{8}$V is output to the output block 30. Also, when the digital control code is increased from '0001' to '0100', the output values of the digital-to-analog converter increase to $\frac{1}{8}$V, $\frac{2}{8}$V, $\frac{3}{8}$V and $\frac{4}{8}$V, respectively. That is, as the resistance values of the digital-to-analog converter is regular, the output voltage differences increase regularly as well according to input digital control codes.

A conventional digital-to-analog converter of a CMOS image sensor uses an array of 32 resistors and outputs 32 voltage values. The voltage values determine the unit voltage of a ramp signal input to the comparator of the CMOS image sensor. A ramp signal decreases as much as the unit voltage, e.g., $\frac{1}{256}$, each clock pulse, so the size of the unit voltage is determined by the output value of the digital-to-analog converter before the output value is input to the comparator.

For instance, when the digital control code is binary '00001', the output voltage of the digital-to-analog converter is $\frac{1}{32}$V. Then, from the output value, the unit voltage of a ramp signal $\frac{1}{256}$V is output. If the digital control code is binary '00010', the voltage output from the digital-to-analog converter is $\frac{2}{32}$V, and from this voltage, the unit voltage of a ramp signal is obtained to be $\frac{2}{256}$V. After that, when the digital control code increases to '00011' and '00100', the unit voltages of the ramp signal increases to $\frac{3}{256}$V and $\frac{4}{256}$V, respectively, in the CMOS image sensor.

The unit voltage of a ramp signal is an amount of decreased voltage per clock cycle. As the unit voltage becomes smaller and smaller, the ramp signal decreases for many clock cycles, and as the unit voltage becomes bigger and bigger, the ramp signal decreases for fewer clock cycles.

The number of clock cycles used while the ramp signals are supplied becomes the range of storable digital data values in the image sensor. That is, if the digital control code is 1000011, the ramp signal of the comparator decreases $\frac{1}{256}$V per clock cycle, and thereafter, the ramp signal decreases for a total of 255 clock cycles. This means that the range of storable digital data values is from 0 to 255.

Figure 2A:
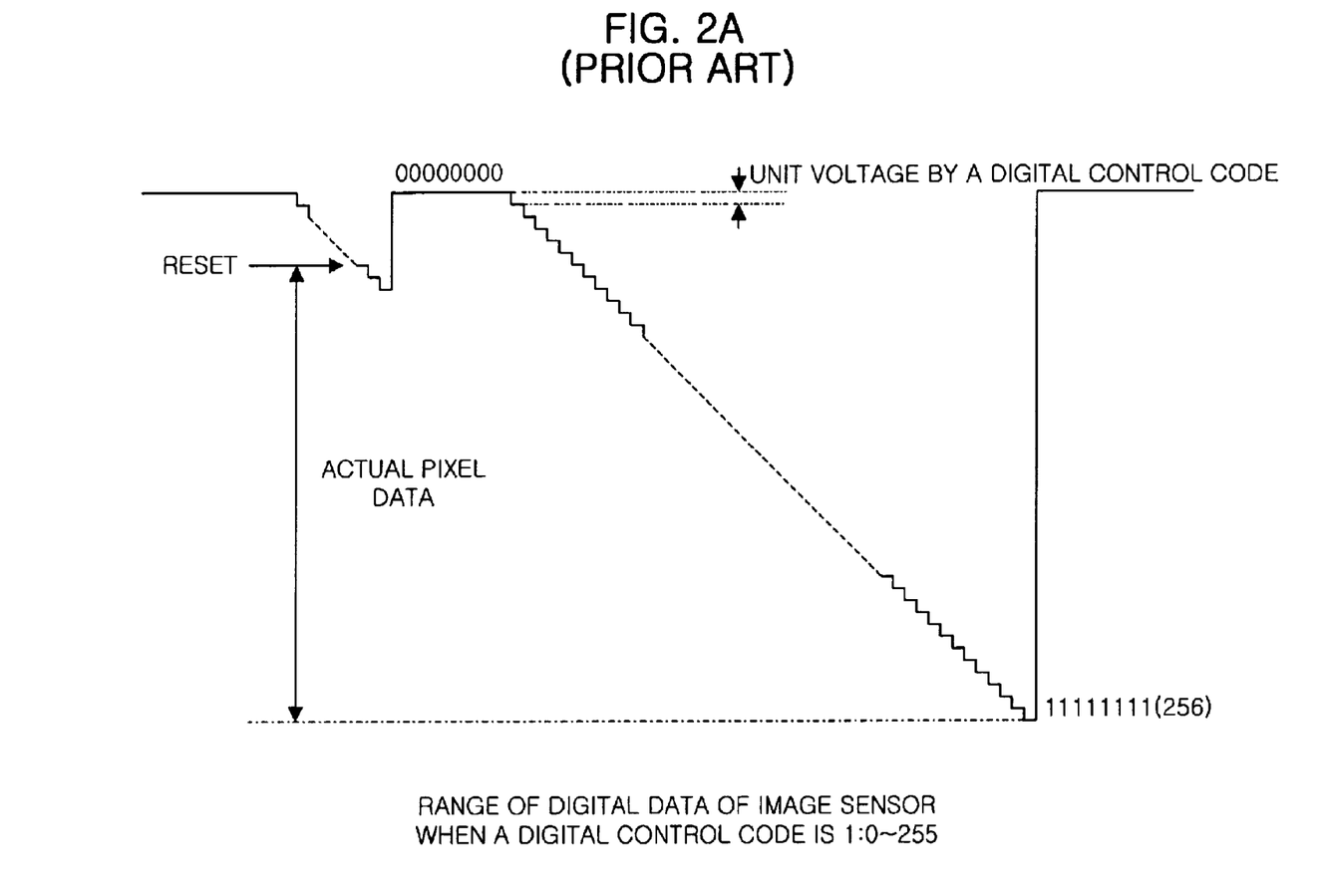
FIG. 2A is a schematic diagram showing a ramp signal when a digital control code input to the digital-to-analog converter is '1'.

FIG. 2A is a schematic diagram showing a ramp signal of a CMOS image sensor wherein the digital control code input to the digital-to-analog converter is binary '00001'.

Referring to FIG. 2A, it is shown that the ramp signal decreases as much as the unit voltage, i.e., $\frac{1}{256}$V, per clock cycle when a digital control code is '00001'. Therefore, the range of digital data values that can be stored in the CMOS image sensor is 'from 0 to 255'.

Figure 2B:
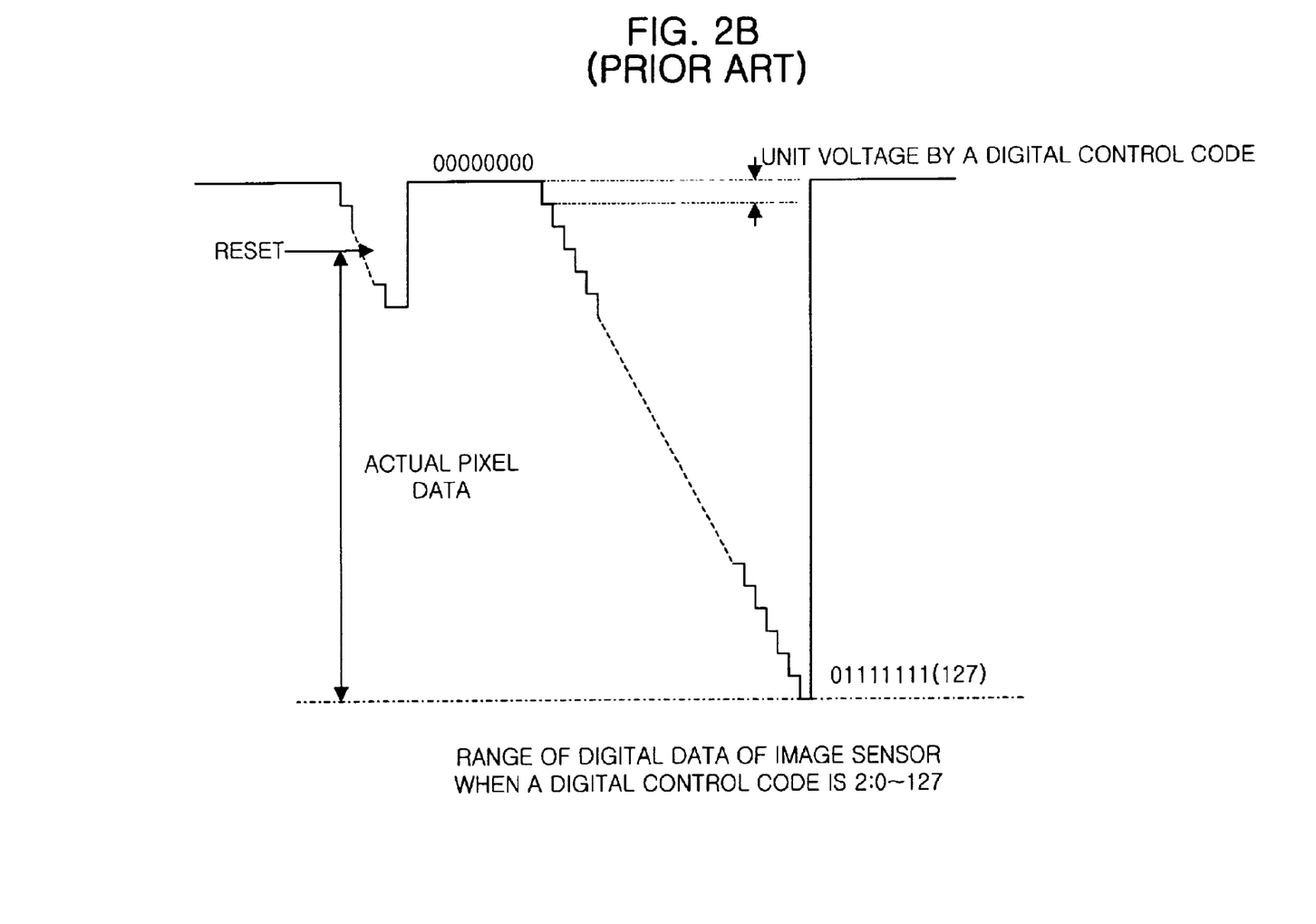
FIG. 2B is a schematic diagram showing a ramp signal when a digital control code input to the digital-to-analog converter is '2'.

FIG. 2B is a schematic diagram showing a ramp signal of a CMOS image sensor, wherein the digital control code inputted to the digital-to-analog converter is binary '00010'.

Referring to FIG. 2B, when the digital control code is '00010', the ramp signal decreases as much as $\frac{2}{256}$V per clock cycle, i.e., the unit voltage, and the range of digital data values storable in the CMOS image sensor is 'from 0 to 127'. Also, if the digital control code is '00011', the range of digital data value is 'from 0 to 63'. As described above, the wider the range of the storable digital values becomes, the brighter the image information is stored.

Figure 3:
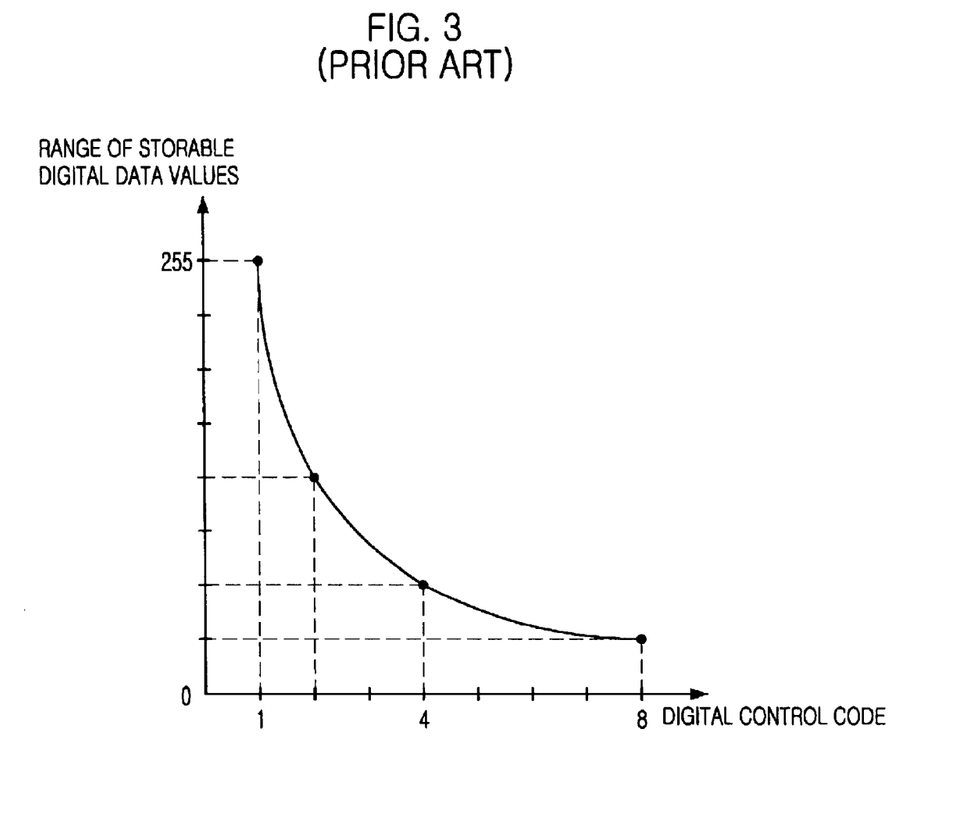
FIG. 3 is a graph representing a range of storable digital data values to a digital control code input to the digital-to-analog converter of a CMOS image sensor.

FIG. 3 is a graph showing the range of the storable digital data values to a digital control code, which is input to the digital-to-analog converter in the CMOS image sensor, and it is represented in TABLE 1 below.

TABLE 1

| Digital Control Code | Analog Output Voltage | Range of Digital Data Values |
|---|---|---|
| 01000 (8) | 8/32 | 0–16 |
| 00110 (6) | 6/32 | 0–32 |
| 00100 (4) | 4/32 | 0–63 |
| 00010 (2) | 2/32 | 0–127 |
| 00001 (1) | 1/32 | 0–255 |

Referring to TABLE 1, even if a digital control code is increased gradually, the range of storable digital data values is not gradually decreased. From this, we can see that the brightness of a stored image of a subject does not change linearly, even if a digital control code is changed linearly. In addition, the brightness of an image cannot be controlled delicately, even though the digital control code is controlled to store the image brighter in a dark place.

Of course, it is possible to control the digital control code and control the brightness of a stored image rather delicately, when the digital control code is relatively big, such as 00110. However, fine controlling here is meaningless and it's still hard to control the range of storable digital data values finely to change the brightness of an image in a practical area, e.g., when the digital control code ranges from 0001 to 0100.

Therefore, a CMOS image sensor is needed that can control the brightness of a stored image by making linear relations between the range of digital data values and the digital control codes.

SUMMARY OF THE INVENTION

In accordance with an embodiment of the present invention, there is provided a digital-to-analog converter, comprising: an array of resistors with weights on their resistance value, for distributing a voltage delicately and outputting a plurality of analog signals; a switching block for selecting and outputting one of the outputs of the arrayed resistors according to digital control codes; and an output means for buffering and outputting an output from the switching block.

In accordance with an embodiment of the present invention, there is provided a CMOS image sensor, comprising: a ramp signal control block for outputting a ramp signal that decreases as much as a unit voltage regularly per clock cycle; and a digital-to-analog converter that outputs a reference voltage to determine the size of the unit voltage. The digital-to-analog converter comprises: a) an array of resistors with weights on their resistance value, for distributing a voltage delicately and outputting a plurality of analog signals; b) a switching block for selecting and outputting one of the outputs of the arrayed resistors according to digital control codes; and c) an output means for buffering and outputting an output from the switching block.

DETAILED DESCRIPTION OF THE INVENTION

Figure 4:
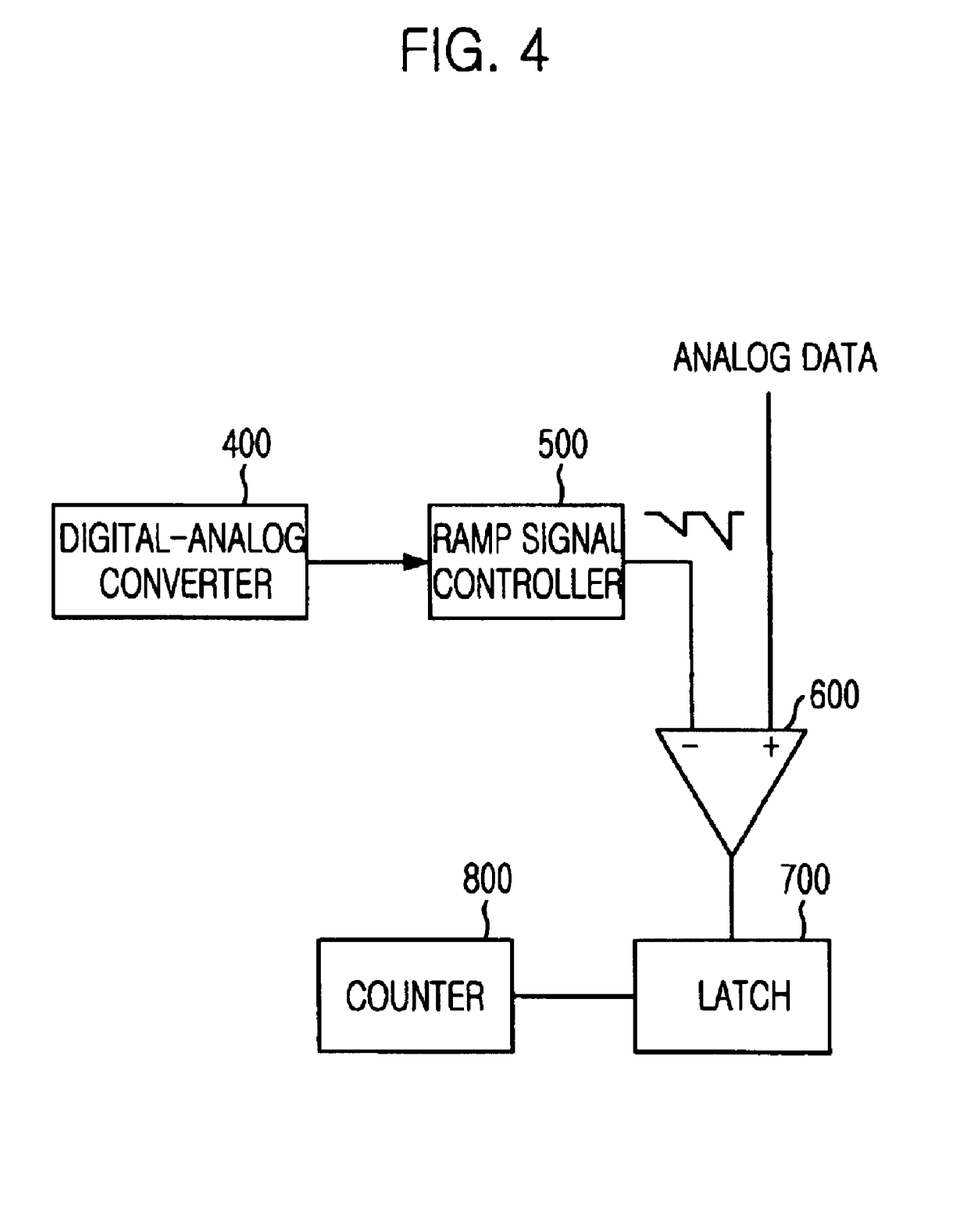
FIG. 4 is a block diagram of a digital-to-analog converter applied to a CMOS image sensor constructed in accordance with the teachings of the invention.

FIG. 4 is a block diagram of a digital-to-analog converter applied to a complementary metal-oxide semiconductor (CMOS) image sensor. The CMOS image sensor comprises: a comparator 600 for receiving a ramp signal and an analog data signal generated at a unit pixel according to the intensity of external light; a ramp signal control block 500 for outputting a ramp signal to the comparator 600; a digital-to-analog converter 400 for determining a unit voltage of a ramp signal; a latch 700 for storing an analog data signal in a digital data signal according to the output of the comparator 600; and a counter 800 for counting the number of clock signals and outputting the counted value to the latch 700.

As described above, a CMOS image sensor includes a digital-to-analog converter to set up a range of digital data values (e.g., 0–255), and according to the output voltage from the digital-to-analog converter, the unit voltage of a ramp signal decreasing according to the reference clock is determined.

Figure 5:
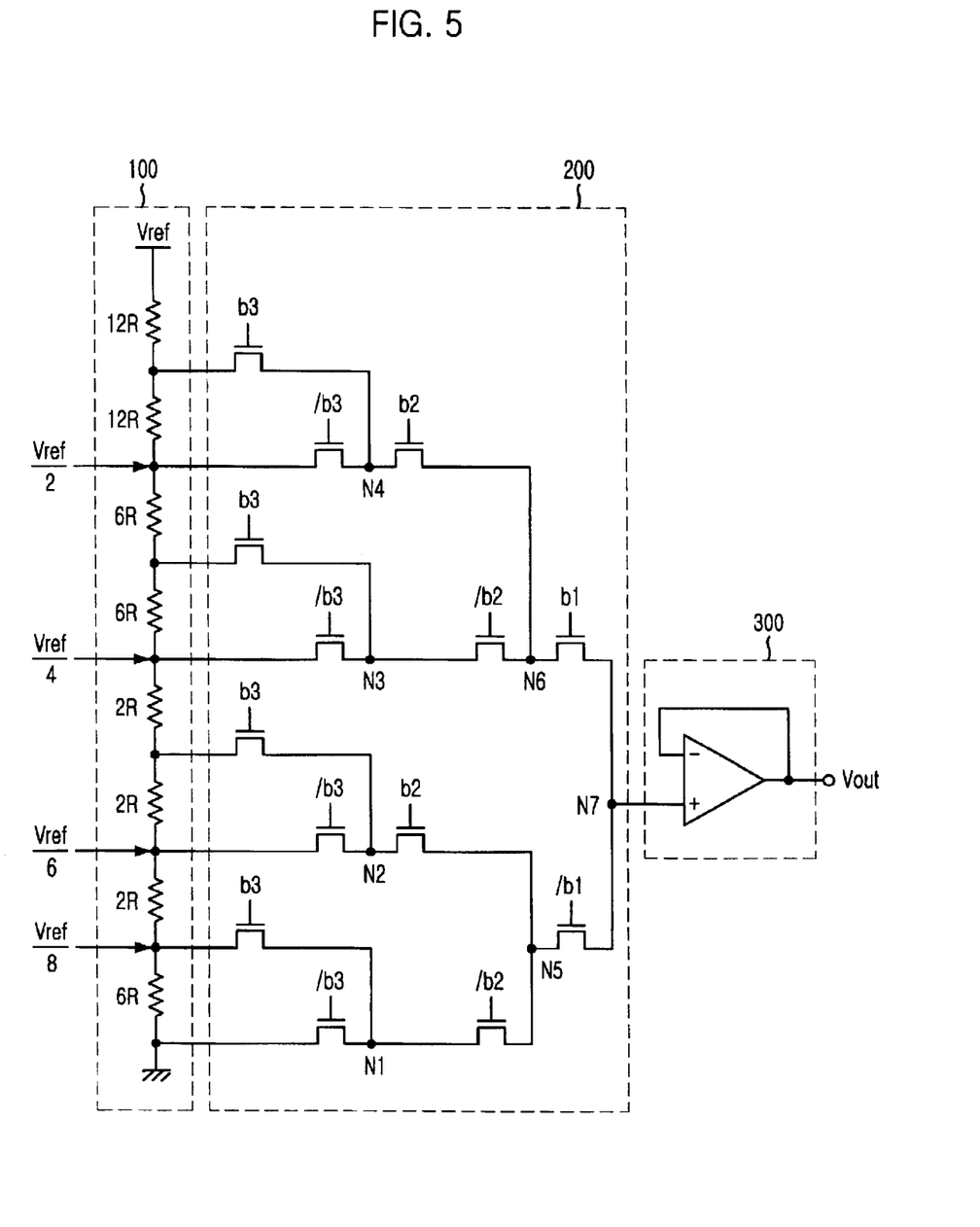
FIG. 5 is a circuit diagram illustrating a digital-to-analog converter of a CMOS image sensor, which is implemented in three bits and constructed in accordance with the teachings of the invention.

FIG. 5 is a circuit diagram illustrating a digital-to-analog converter of a CMOS image sensor implemented in three bits in accordance with the teachings of the invention.

Referring to FIG. 5, the digital-to-analog converter is composed of a voltage divider 100, a switching block 200 and an output block 300.

The voltage divider 100 consists of a plurality of resistors connected in serial, which distribute the reference voltage (Vref) in a predetermined ratio and output the voltages to the switching circuit 200. The voltage divider 100 illustrated in the drawing is an example of a three-bit digital-to-analog converter with eight resistors serially connected between the reference voltage (Vref) and the ground voltage level. The weights of the eight resistors are 12R, 12R, 6R, 2R, 2R, 2R, 2R, and 6R, respectively. Here, R denotes a unit resistor. For example, when the unit resistor (R) is 100Ω, 2R becomes 200Ω.

In the switching circuit 200, a plurality of switches connect the voltage divider 100 and the output circuit 300 so that only one path is selected by a decoded digital control code.

Still referring to FIG. 5, the switching circuit 200 includes: four NMOS transistors, wherein the transistors' gates receive a first bit signal (b3) of a three-bit decoder signal for electrically connecting first, third, fifth and seventh resistors from a ground voltage level to nodes N1, N2, N3, and N4, respectively; four NMOS transistors, wherein the transistors' gates receive an inverted signal (/b3) of the first bit signal of a three-bit decoder signal for electrically connecting second, fourth, sixth, and eighth resistors to nodes N1, N2, N3, and N4, respectively; two NMOS transistors, wherein the transistors' gates receive a second bit signal (b2) of a three-bit decoder signal for electrically connecting nodes N2 and N4 to nodes N5 and N6, respectively; two NMOS transistors, wherein the transistors' gates receive an inverted signal (/b2) of a second bit signal of the three-bit decoder signal for electrically connecting nodes N1 and N3 to nodes N5 and N6; an NMOS transistor, wherein the transistor's gate receives a third bit signal (b1) of a three-bit decoder signal supplied for electrically connecting nodes N6 to N7; and an NMOS transistor, wherein the transistor's gate receives an inverted signal of the third bit signal (/b1) for electrically connecting nodes N5 and N7.

The output circuit 300 comprises an operation amplifier which feedback the output to a negative (−) input and serves as a buffer. When the output of the operation amplifier is fed back to the negative (−) input, the operation amplifier operates as a buffer that outputs the voltage of the positive input.

The operation of the digital-to-analog converter from FIG. 5 will be described hereinafter.

When the reference voltage (Vref) is '1V' and a digital control code '110' is input to the switching circuit 200, switches receiving the signals b1, b2, and /b3 that are input to the switching circuit 200 are turned on and a voltage ½V is output to the output block 300. Also, when the digital control code is increased from '001' to '100' gradually, the output voltages of the digital-to-analog converter increase to ⅛V, ⅙V, 5/24V and ¼V, respectively.

In short, when the serially connected resistors of the digital-to-analog converter are controlled, the output voltages increase with the weights, not regularly input digital control codes. The output voltages to digital control codes are shown in TABLE 2.

TABLE 2

| Digital Control Code | Analog Voltage |
|---|---|
| 8 | Vref |
| 6 | 1/2 Vref |
| 4 | 1/4 Vref |
| 2 | 1/6 Vref |
| 1 | 1/8 Vref |

Figure 6:
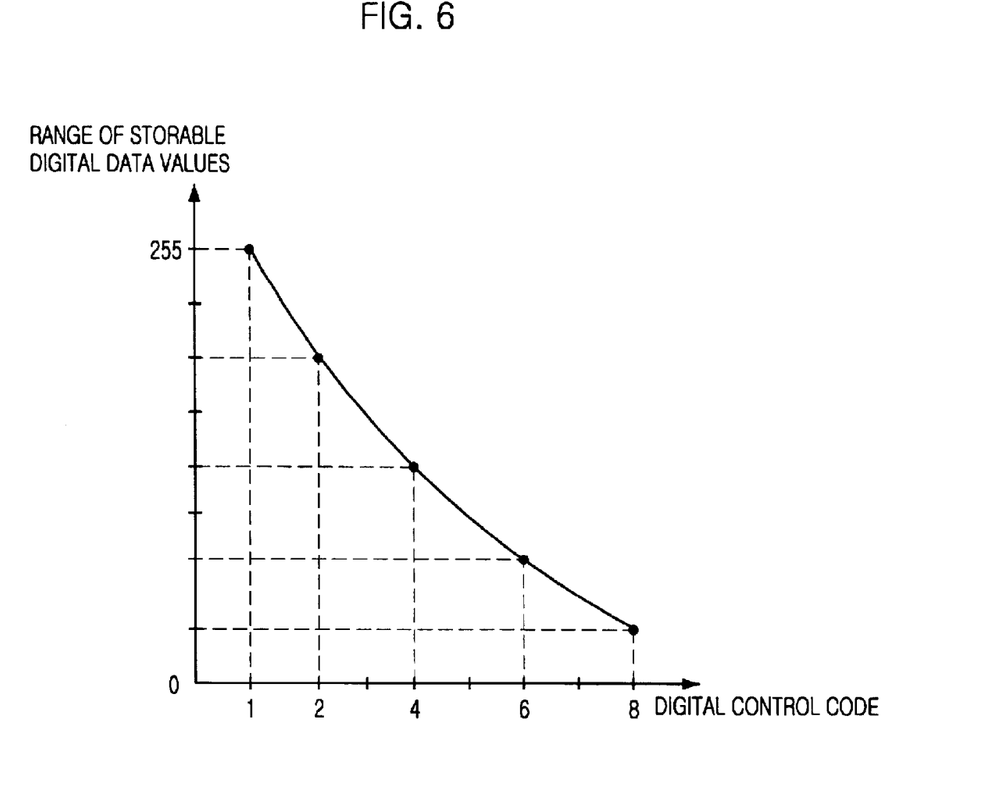
FIG. 6 is a graph showing a range of storable digital data values to a digital control code input to the digital-to-analog converter of a CMOS image sensor constructed in accordance with the teachings of the invention.

FIG. 6 is a graph showing the range of digital data values that the CMOS image sensor can output, to a digital control code input to the digital-to-analog converter of FIG. 5, in accordance with the teachings of the invention.

Referring to FIG. 6, the range of the storable digital data values to the input digital control codes has a relatively linear shape. The brightness of an image can thus be controlled delicately by controlling the digital control codes. Also, when a dark part needs to be shown brighter, the brightness of an image can be controlled delicately by handling a digital control code.

The range of storable digital data values provide a linear shape when compared to a digital control code. This occurs by controlling the resistor array of the digital-to-analog converter in the digital control block. The line shown in FIG. 6 is formed by controlling the resistor array. Therefore, the 32 resistors described above are divided in several parts and the divided resistors are assigned different weights. When a more delicate line is needed to be shaped, the weights of the all resistors are controlled.

The digital-to-analog converter constructed in accordance with the teachings of the invention controls the brightness of an image more delicately, particularly, the brightness of a dark part of an image.

While the teachings of the invention have been described with respect to certain preferred embodiments, it will be apparent to those skilled in the art that various changes and modifications may be made without departing from the scope of the invention as defined in the following claims.

What is claimed is:

1. A digital-to-analog converter included in an image sensor to control a brightness of an image more delicately, comprising:

an array of resistors, each resistor having a different resistance value based on a predetermined ratio, adapted to distribute a voltage delicately and output a plurality of analog signals;

a switching circuit adapted to select and output one of the analog signals of the arrayed resistors in response to a digital control code;

an output circuit adapted to buffer and develop an output from the switching circuit having a nonlinear response to the digital control codes; and wherein the predetermined ratio is based on an amplification rate of a pixel signal relating to the image having a linear response to the digital control codes.

2. The digital-to-analog converter as recited in claim 1, wherein the switching circuit includes a plurality of switches so that only one path is selected by a digital control code, when the voltage distributed by the resistor array is connected to the output circuit.

3. The digital-to-analog converter as recited in claim 2, wherein the plurality of switches are implemented with transistors.

4. The digital-to-analog converter as recited in claim 3, wherein the output circuit includes an operation amplifier that feeds back the output of the output circuit to a negative input.

5. A CMOS image sensor, comprising:

a ramp signal control block adapted to develop a ramp signal that decreases as much as a unit voltage regularly per clock cycle; and a digital-to-analog converter that outputs a reference voltage to determine the size of the unit voltage, wherein the digital-to-analog converter adapted to control a brightness of an image more delicately comprises:

a) an array of resistors, each resistor having a different resistance value based on a predetermined ratio, adapted to distribute a voltage delicately and output a plurality of analog signals;

b) a switching circuit adapted to select and output one of the analog signals of the arrayed resistors in response to a digital control code;

c) an output circuit adapted to buffer and develop an output from the switching circuit having a nonlinear response to the digital control codes; and     wherein the predetermined ratio is based on an amplification rate of a pixel signal relating to the image having a linear response to the digital control codes.

6. The digital-to-analog converter as recited in claim 5, wherein the switching circuit includes a plurality of switches so that only one path is selected by a digital control code, when the voltage distributed by the resistor array is connected to the output circuit.

7. The digital-to-analog converter as recited in claim 6, wherein the plurality of switches are implemented with transistors.

8. The digital-to-analog converter as recited in claim 7, wherein the output circuit includes an operation amplifier that feeds back the output of the output circuit to a negative input.

* * * * *